(12) United States Patent
Fukuda et al.

(10) Patent No.: US 11,837,301 B2
(45) Date of Patent: Dec. 5, 2023

(54) SUBSTRATE, PRINTING APPARATUS, AND MANUFACTURING METHOD

(71) Applicant: CANON KABUSHIKI KAISHA, Tokyo (JP)

(72) Inventors: Masashi Fukuda, Kanagawa (JP); Toshio Negishi, Kanagawa (JP); Yasuhiro Soeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 22 days.

(21) Appl. No.: 17/685,479

(22) Filed: Mar. 3, 2022

(65) Prior Publication Data

US 2022/0293200 A1 Sep. 15, 2022

(30) Foreign Application Priority Data

Mar. 10, 2021 (JP) ................................. 2021-038579

(51) Int. Cl.
*G11C 17/16* (2006.01)
*G11C 5/14* (2006.01)
*G11C 7/10* (2006.01)

(52) U.S. Cl.
CPC .............. *G11C 17/165* (2013.01); *G11C 5/14* (2013.01); *G11C 7/1096* (2013.01)

(58) Field of Classification Search
CPC ....... G11C 17/165; G11C 5/14; G11C 7/1096; G11C 5/145; G11C 5/147; G11C 17/16; G11C 17/18; B41J 2/01; B41J 3/407; H10B 20/20
See application file for complete search history.

(56) References Cited

U.S. PATENT DOCUMENTS

| | | | |
|---|---|---|---|
| 7,626,881 B2 | 12/2009 | Tomita | |
| 2008/0043510 A1 | 2/2008 | Tomita | |
| 2013/0313663 A1 | 11/2013 | Kato et al. | |
| 2013/0321039 A1 | 12/2013 | Soeda | |
| 2018/0061506 A1* | 3/2018 | Fujii | ...................... G11C 17/16 |
| 2018/0281390 A1* | 10/2018 | Fujii | ................... B41J 2/04511 |

FOREIGN PATENT DOCUMENTS

JP 2008-047215 A 2/2008

* cited by examiner

*Primary Examiner* — Ajay Ojha
(74) *Attorney, Agent, or Firm* — Venable LLP

(57) ABSTRACT

A substrate includes a plurality of memory units each including an anti-fuse element and a switching element configured to switch application of a predetermined voltage to the anti-fuse element, a wiring to which the plurality of memory units are connected, a first electrode pad to which a voltage for supplying the predetermined voltage to the wiring is applied, and a second electrode pad to which a voltage for supplying the predetermined voltage to the wiring is applied.

11 Claims, 6 Drawing Sheets

SUBSTRATE, PRINTING APPARATUS, AND MANUFACTURING METHOD

BACKGROUND OF THE INVENTION

Field of the Invention

The present invention relates to a substrate having an anti-fuse element.

Description of the Related Art

An OTP (One Time Programmable) memory is used to record product-specific information such as a chip ID and setting parameters after completion of a product. A memory using an anti-fuse element as the OTP memory is known (Japanese Patent Laid-Open No. 2008-47215).

Write power for the anti-fuse element is supplied from the internal power supply of a product incorporating the memory. In a product including many anti-fuse elements, the number of anti-fuse elements to simultaneously write is limited by the output of the internal power supply. In a write operation before product shipment, from the viewpoint of production efficiency, it is advantageous to make the simultaneous write count large. However, if the output of the internal power supply is increased only for this purpose, it is wasteful in the viewpoint of product use after shipment.

SUMMARY OF THE INVENTION

The present invention provides a technique capable of increasing write power for an anti-fuse element as needed.

According to an aspect of the present invention, there is provided a substrate comprising: a plurality of memory units each including an anti-fuse element and a switching element configured to switch application of a predetermined voltage to the anti-fuse element; a wiring to which the plurality of memory units are connected; a first electrode pad to which a voltage for supplying the predetermined voltage to the wiring is applied; and a second electrode pad to which a voltage for supplying the predetermined voltage to the wiring is applied.

Further features of the present invention will become apparent from the following description of exemplary embodiments (with reference to the attached drawings).

DESCRIPTION OF THE EMBODIMENTS

Figure 1:
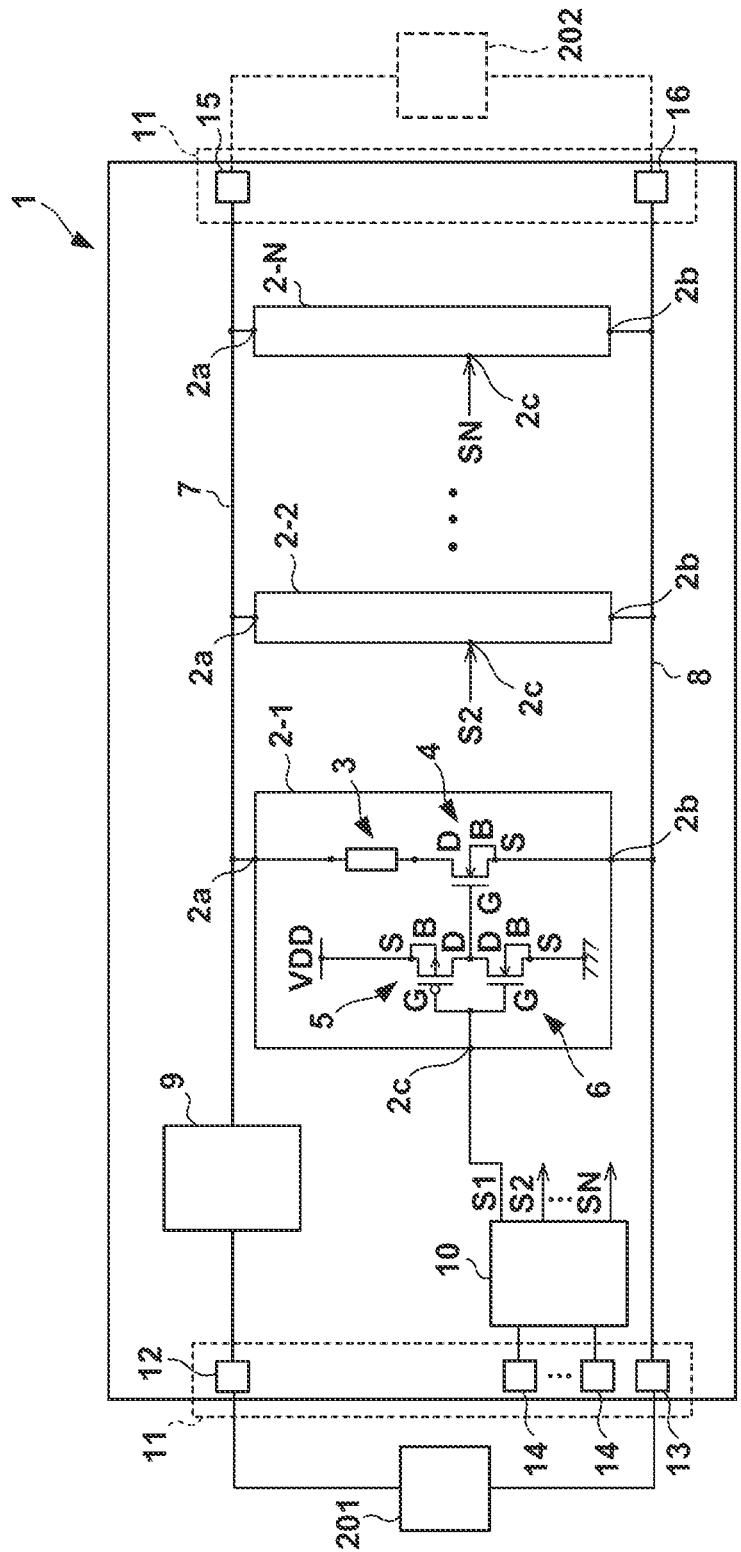
FIG. 1 is a circuit diagram of a substrate according to an embodiment of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

FIG. 1 is a circuit diagram of a substrate 1 according to an embodiment of the present invention. The substrate 1 is a storage device including a plurality of memory units 2-1 to 2-N. In this embodiment, N memory units 2-1 to 2-N are provided, which will be expressed as memory units 2 collectively or without distinction between individual memory units. Each memory unit 2 is a memory circuit including an anti-fuse element 3 and capable of holding 1-bit information. FIG. 1 shows the circuit of only the memory unit 2-1. The remaining memory units 2-2 to 2-N have the same circuit.

The anti-fuse element 3 is an element which has, for example, a MOS structure (Metal Oxide Semiconductor structure) and whose resistance value changes before and after information write. In this embodiment, the anti-fuse element 3 functions as a capacitance element before information is written, and functions as a resistive element after information is written. That is, the resistance value of the anti-fuse element 3 is changed by an information write operation, and 1-bit information can be expressed by this.

The N memory units 2 are connected in parallel between a wiring 7 and a wiring 8. The anti-fuse element 3 of each memory unit 2 is connected to the wiring 7 via a connection point 2a. Also, the anti-fuse element 3 of each memory unit 2 is connected to the wiring 8 via a switching element 4 and a connection point 2b. In this embodiment, the write voltage of the anti-fuse element 3 is applied to the wiring 7, and the wiring 8 is set at the ground potential (GND potential). The write voltage is, for example, 32 V.

The switching element 4 is an element that switches write voltage application to the anti-fuse element 3, and is a high breakdown voltage NMOS transistor in this embodiment. A high breakdown voltage transistor (DMOS transistor (Double-diffused MOSFET)) is a transistor having a breakdown voltage higher than that of transistors (switching elements 5 and 6 to be described later) used in a logic circuit. A higher voltage can be applied to the high breakdown voltage transistor. A drain D of the switching element 4 is connected to the anti-fuse element 3, and a source S and a back gate B are connected to the wiring 8 via the connection point 2b. When the switching element 4 is turned on, the voltage applied to the wiring 7 can be applied to the anti-fuse element 3.

A gate G of the switching element 4 is connected to the transistors 5 and 6. In this embodiment, the transistors 5 and 6 constitute a logic circuit (an inverter in this embodiment). In this embodiment, the transistor 5 is a PMOS transistor, and the transistor 6 is an NMOS transistor. A voltage VDD is supplied to the source S and the back gate B of the transistor 5. The drain D of the transistor 5 is connected to the drain D of the transistor 6 and the gate G of the switching element 4. The source S and the back gate B of the transistor 6 are grounded. When transistors having a breakdown voltage lower than that of the switching element 4 are used as the transistors 5 and 6 that constitute the logic circuit, the logic circuit can be operated at a high speed.

The substrate 1 includes a signal control circuit 10, and the gates G of the transistors 5 and 6 are connected to the signal control circuit 10. The signal control circuit 10 outputs, to the memory units 2-1 to 2-N, corresponding control signals (selection signals) S1 to SN via connection points 2c.

The substrate 1 includes an electrode pad group 11 serving as an electrical contact to a device outside the substrate 1. The electrode pad group 11 includes electrode pads 12 and 13. A power supply voltage is applied from an internal power supply 201 of a device (not shown) including the substrate 1 to the electrode pad 12. The GND of the internal power supply 201 is connected to the electrode pad 13. The substrate 1 includes a voltage applying circuit 9 connected between the electrode pad 12 and the wiring 7.

Based on the power supply voltage applied to the electrode pad 12, the voltage applying circuit 9 outputs a write voltage to the wiring 7. The voltage applying circuit 9 can include a switching circuit configured to switch the write voltage application to the wiring 7. The electrode pad group 11 can include an electrode pad to which a control signal to the switching circuit is input. Also, the voltage applying circuit 9 may include a boosting circuit configured to boost the power supply voltage to the write voltage if the power supply voltage applied to the electrode pad 12 is lower than the write voltage. In addition, the voltage applying circuit 9 may include a step-down circuit configured to step down the power supply voltage to the write voltage if the power supply voltage applied to the electrode pad 12 is higher lower than the write voltage.

The electrode pad group 11 includes a plurality of electrode pads 14. Control signals for controlling the signal control circuit 10 are input from the control circuit (not shown) of the device (not shown) including the substrate 1 to the electrode pads 14. The electrode pad group 11 also includes electrode pads 15 and 16. The electrode pad 15 is connected to the wiring 7, and the electrode pad 16 is connected to the wiring 8. An external power supply 202 outside the device including the substrate 1 can selectively be connected to the electrode pad 15, and the write voltage can be applied from the external power supply 202. Note that although the electrode pad 13 and the electrode pad 16 are connected as the electrode pads connected to the wiring 8 in this embodiment, one of these may suffice.

An operation when writing information to the anti-fuse element 3 will be described next. The information write to the anti-fuse element 3 can be done in the manufacturing process of the substrate 1 before shipment of the substrate 1 or the product incorporating the substrate 1 or at the time of an operation of the product after the shipment.

First, in a state in which the write voltage is applied to the wiring 7, a control signal of low level (a signal of the ground potential) is output from the signal control circuit 10 to the memory unit 2 that is the information write target. For example, to write information to the anti-fuse element 3 of the memory unit 2-2, the control signal S2 is output from the signal control circuit 10 to the connection point 2c of the memory unit 2-2.

In the memory unit 2 that has received the control signal of low level from the signal control circuit 10, the transistor 5 is turned on, and the transistor 6 is turned off to apply the voltage VDD to the gate G of the switching element 4, thereby turning on the switching element 4. As a result, the write voltage is applied to the anti-fuse element 3, and the anti-fuse element 3 changes from a capacitance element to a resistive element. Note that a detailed example of the configuration of the anti-fuse element 3 having such a characteristic will be described later with reference to FIG. 3.

The write voltage to be applied to the wiring 7 can be supplied by the voltage applying circuit 9. However, when simultaneously writing information to the anti-fuse elements 3 of a lot of memory units 2, the write current increases in proportion to the number of anti-fuse elements 3 to simultaneously write information. As a result, the power of the voltage applying circuit 9 may be insufficient, and the number of anti-fuse elements 3 to which information can be written simultaneously may be limited. At the production site where the substrate 1 before shipment is manufactured, it is necessary to shorten the information write time and improve tact. Hence, a circuit configuration capable of simultaneously writing information to a larger number of anti-fuse elements 3 is demanded.

In this embodiment, in addition to the electrode pad 12 configured to supply the write voltage to the wiring 7, to which the power supply voltage is applied, the electrode pad 15 configured to supply the write voltage to the wiring 7, to which the power supply voltage of the external power supply 202 is applied, is provided. When writing information to a lot of anti-fuse elements 3 in the manufacturing process of the substrate 1, the external power supply 202 is connected to the electrode pad 15, and the write voltage is supplied from the external power supply 202 to the wiring 7. When both the internal power supply 201 and the external power supply 202 are used, the power necessary for writing information to a lot of anti-fuse elements 3 can be supplied to the wiring 7. Alternatively, the power necessary for writing information to a lot of anti-fuse elements 3 may be supplied to the wiring 7 using only the external power supply 202 without using the internal power supply 201.

As described above, in this embodiment, the write power for the anti-fuse elements 3 can be increased as needed. Hence, when writing product-specific information to the memory units 2 at the production site before product shipment, the write voltage can be supplied to the wiring 7 using the internal power supply 201 and the external power supply 202 or using only the external power supply 202. This makes it possible to simultaneously write information to a lot of anti-fuse elements 3. When writing information to the memory units 2 after product shipment, the write voltage can be supplied to the wiring 7 using the internal power supply 201. Hence, information such as an operation history in the device including the substrate 1 can also be stored in the memory units 2.

Note that to read out the information written to the memory units 2, for example, a current having a predetermined current value is supplied from the wiring 7 to the anti-fuse element 3 of the memory unit 2 as the read target. A voltage generated in the anti-fuse element 3 (the potential difference between the connection point 2a and the connection point 2b) is measured, and this voltage can be read out as information.

Modification

Figure 2:
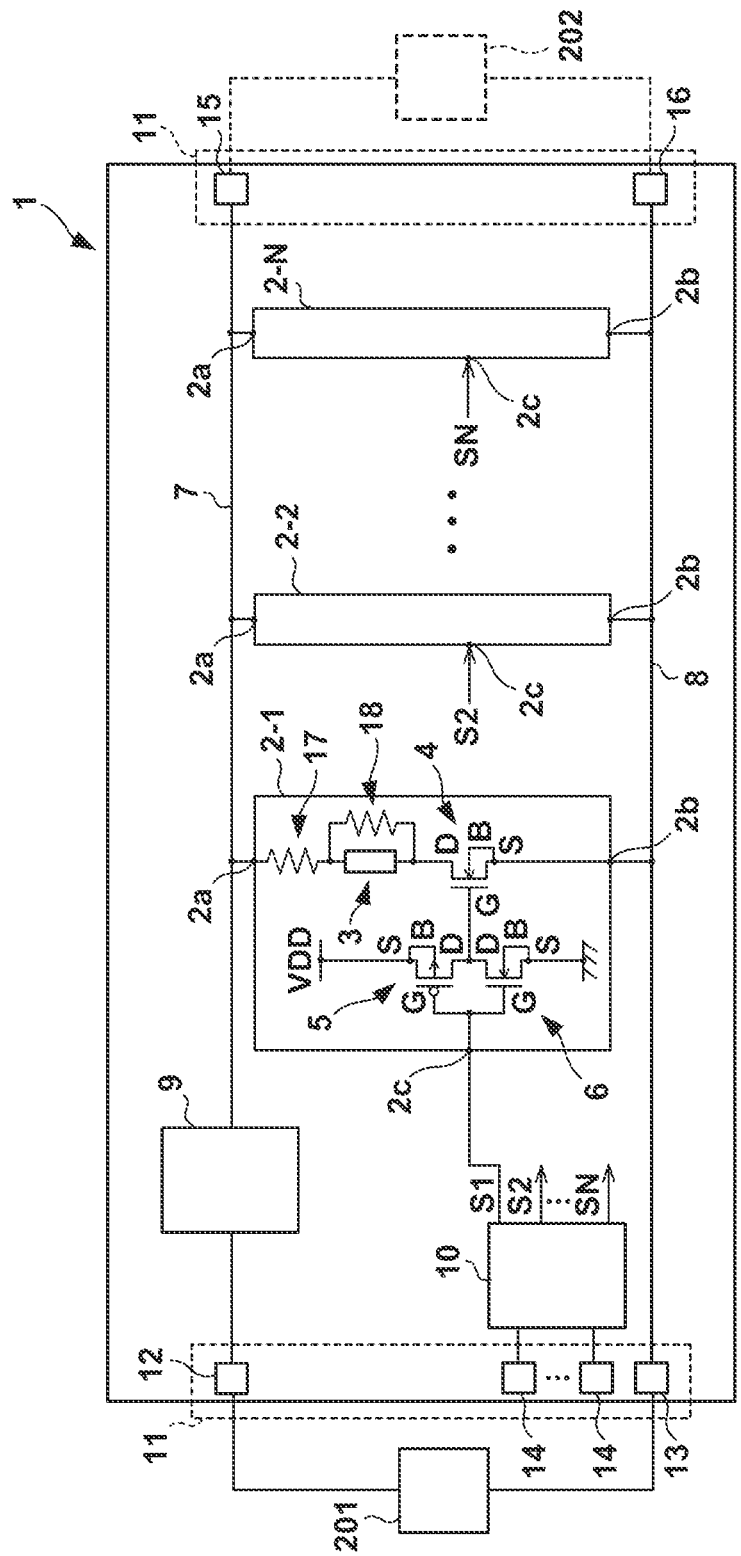
FIG. 2 is a circuit diagram showing a modification of the substrate shown in FIG. 1.

FIG. 2 shows a modification of the substrate 1. In the substrate 1 shown in FIG. 2, the memory unit 2 includes resistive elements 17 and 18. The resistive element 17 is a resistive element serving as a countermeasure against static electricity, which is connected between the wiring 7 and the anti-fuse element 3. For example, if a surge voltage is applied to the electrode pad 15, the resistive element 17 absorbs the electric energy of the surge voltage, thereby preventing the anti-fuse element 3 from being broken by the electric energy.

When the anti-fuse element 3 is in a capacitance element state before write, the resistive element 18 can fix the voltage applied to the drain D of the switching element 4 in the off state of the switching element 4 to the voltage (write voltage) of the wiring 7.

<Substrate Structure>

Figure 3:
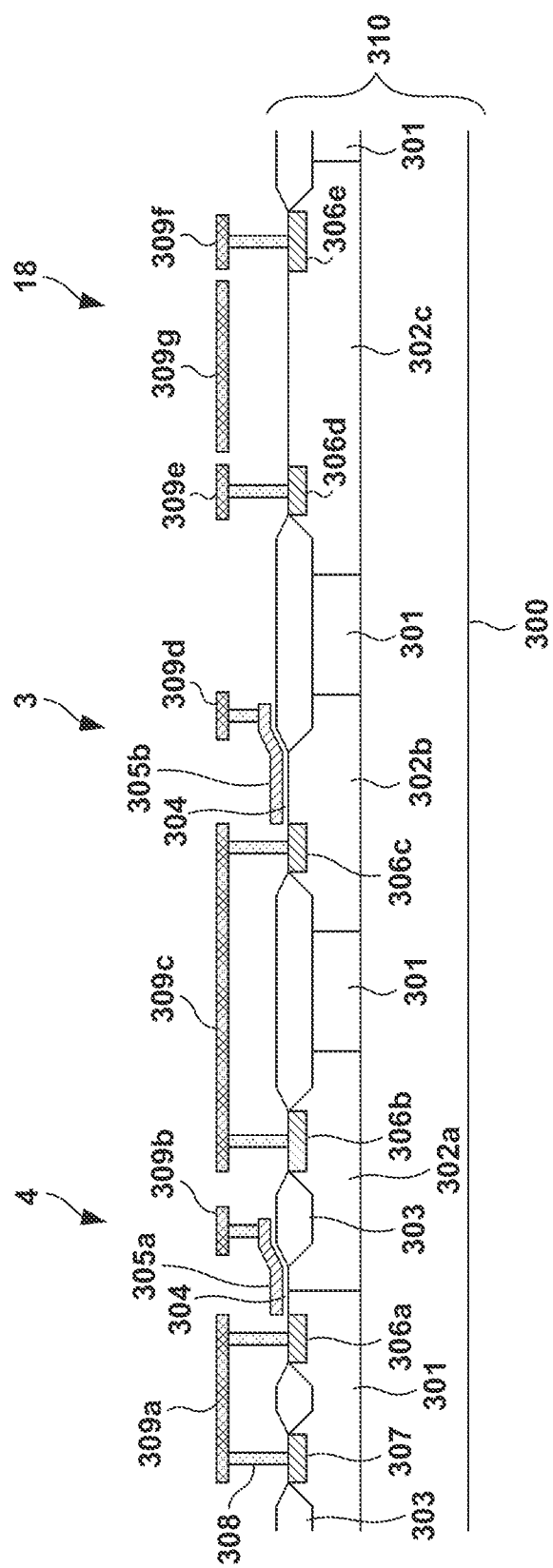
FIG. 3 is an explanatory view of the structure of a substrate shown in FIG. 2.

FIG. 3 shows a detailed example of the sectional structure of the anti-fuse element 3, the resistive element 18, and the switching element 4 in the substrate 1 shown in FIG. 2. The substrate 1 includes a semiconductor substrate 310.

In the semiconductor substrate 310, p-type well regions 301 and n-type well regions 302a, 302b, and 302c are formed on a p-type silicon substrate 300. The p-type well regions 301 can be formed by the same process as the p-type wells of the NMOS transistor 6 that constitutes the logic circuit. The n-type well regions 302a, 302b, and 302c can be formed by the same process as the n-type wells of the PMOS transistor 5 that constitutes the logic circuit.

Note that the impurity concentration in the n-type well regions with respect to the p-type silicon substrate 300 is such a concentration that makes the breakdown voltage between the p-type silicon substrate 300 and the n-type well regions 302a, 302b, and 302c higher than the write voltage. In addition, the impurity concentration in the p-type well regions 301 and the n-type well regions 302a, 302b, and 302c is such a concentration that makes the breakdown voltage between the p-type well regions 301 and the n-type well regions 302a and 302b higher than the write voltage.

A field oxide film 303, heavily-doped n-type diffusion regions 306a to 306e, and a heavily-doped p-type diffusion region 307 are formed in the p-type well regions 301 and the n-type well regions 302a, 302b, and 302c. The field oxide film 303 can be formed by, for example, a LOCOS (Local Oxidation of Silicon) method.

The configuration of the switching element 4 that is a high breakdown voltage NMOS transistor will be described. A gate electrode 305a forming the gate G is arranged on a gate insulating film 304 on the p-type well region 301 and the n-type well region 302a, which are adjacent to each other. A region where the p-type well region 301 and the gate electrode 305a overlap is a channel forming region.

The heavily-doped n-type diffusion region 306a is the source S of the switching element 4, and the heavily-doped p-type diffusion region 307 is an electrode that forms the back gate B. The n-type well region 302a includes, as a field relaxing region of the drain D, a portion extending up to below the gate electrode 305a. The heavily-doped n-type diffusion region 306b formed in the n-type well region 302a is the electrode of the drain D of the switching element 4.

In addition, the drain side of the gate electrode 305a has a structure running onto the field oxide film 303 formed in the n-type well region 302, that is, a so-called LOCOS offset structure. Hence, even if the voltage of the electrode of the drain D rises to the write voltage in the off state of the switching element 4, that is, when the voltage of the gate electrode 305a is the ground voltage (GND), the gate-drain breakdown voltage can be ensured.

The structure of the anti-fuse element 3 will be described next. The anti-fuse element 3 includes an upper electrode, a lower electrode, and an insulating layer (gate insulating film 304) therebetween. For example, an electrode 305b provided on the gate insulating film 304 on the n-type well region 302b functions as the upper electrode of the anti-fuse element 3. Also, in the n-type well region 302b, a portion that is connected to the heavily-doped n-type diffusion region 306c and overlaps the upper electrode in a planar view to the surface of semiconductor substrate 310, on which the elements such as the switching element 4 are arranged, functions as the lower electrode. When a predetermined voltage is applied between the upper electrode and the lower electrode, the gate insulating film 304 causes dielectric breakdown, and the resistance value of the anti-fuse element 3 can be lowered.

Note that the planar view to the surface on which the elements such as the switching element 4, the anti-fuse element 3, and the resistive element 18 are arranged is, for example, a planar view to the surface of the channel forming region of the switching element 4.

In FIG. 3, the heavily-doped n-type diffusion region 306c is formed only in a region of the n-type well region 302b, which does not overlap the upper electrode in the planar view. However, the heavily-doped n-type diffusion region 306c is not limited to this. For example, the heavily-doped n-type diffusion region 306b may be formed in a part of the portion overlapping the upper electrode, or all over the overlapping portion. If the heavily-doped n-type diffusion region 306c is also formed in the region overlapping the upper electrode in the planar view, the overlapping portion of the heavily-doped n-type diffusion region 306c also functions as the lower electrode of the anti-fuse element 3.

In FIG. 2, the lower electrode of the anti-fuse element 3 is connected to the drain D of the switching element 4. However, the upper electrode may be connected to the drain D of the switching element 4, and the lower electrode may be connected to the wiring 7.

The gate insulating film 304 can be formed by the process of forming the gate insulating films of the transistors 5 and 6 that constitute the logic circuit, and can be formed by, for example, an oxide film. The electrodes 305a and 305b can be formed by, for example, a polysilicon layer. The polysilicon layer, the heavily-doped n-type diffusion regions 306a to 306c, and the heavily-doped p-type diffusion region 307 can be formed by the same process as the process of forming the elements of the transistors 5 and 6 constituting the low breakdown voltage logic circuit.

As described above, the anti-fuse element 3 is an anti-fuse element having a MOS structure, and the switching element 4 that controls write to the anti-fuse element 3 is a MOS transistor. Hence, the anti-fuse element 3 and the switching element 4 can be formed by the same process. It is therefore possible to inexpensively form a semiconductor element in a small number of processes.

An insulating film with a plurality of contact portions 308 is provided on the heavily-doped p-type diffusion region 307, the heavily-doped n-type diffusion regions 306a to 306e, and the field oxide film 303, and conductive layers 309a to 309g are provided on the insulating film. The conductive layers 309a to 309g can be made of a metal such as, for example, aluminum. Note that the manufacturing method, material, and structure are not limited as long as the conductive layers 309a to 309g, the electrodes, the wirings are electrically connected.

In FIG. 3, a capacitance element whose lower electrode and upper electrode are formed by an n-type well region and polysilicon is shown as an example of the anti-fuse element 3. However, the anti-fuse element 3 is not limited to this structure, and may be, for example, a capacitance element using a PMOS transistor. One of the lower electrode and the upper electrode of the anti-fuse element 3 functions as one terminal, and the other functions as the other terminal.

The resistive element 18 includes the n-type well region 302c that is a semiconductor region in the semiconductor substrate 310, and is connected to the conductive layers 309e and 309f via the heavily-doped n-type diffusion regions 306d and 306e, respectively. The resistive element 18 is not limited to this structure. For example, a resistor made of a conductive layer or a resistor made of polysilicon may be used as the resistive element 18.

The insulating film is an insulator layer formed on the semiconductor substrate 310 to cover the switching element 4, the resistive element 18, and the like, and is made of, for example, silicon oxide. The insulator layer is not limited to this, and may be made of silicon nitride or silicon carbide, or may be a stacked structure or mixture layer thereof.

The conductive layer 309a is connected to the source S and the back gate B of the switching element 4 via the contact portions 308 and is given the ground potential. The conductive layer 309b is connected to the electrode of the drain D of the switching element 4 and the lower electrode of the anti-fuse element 3 via the contact portions 308. The conductive layer 309c is connected to the upper electrode of the anti-fuse element 3 via the contact portion 308 and is connected to the wiring 7 by a portion (not shown). When writing information, the voltage applying circuit 9 applies the write voltage to the conductive layer 309c. The conductive layer 309d is connected to the conductive layer 309c (not shown), and the conductive layer 309e is connected to the conductive layer 309b (not shown).

Second Embodiment

Figure 4:
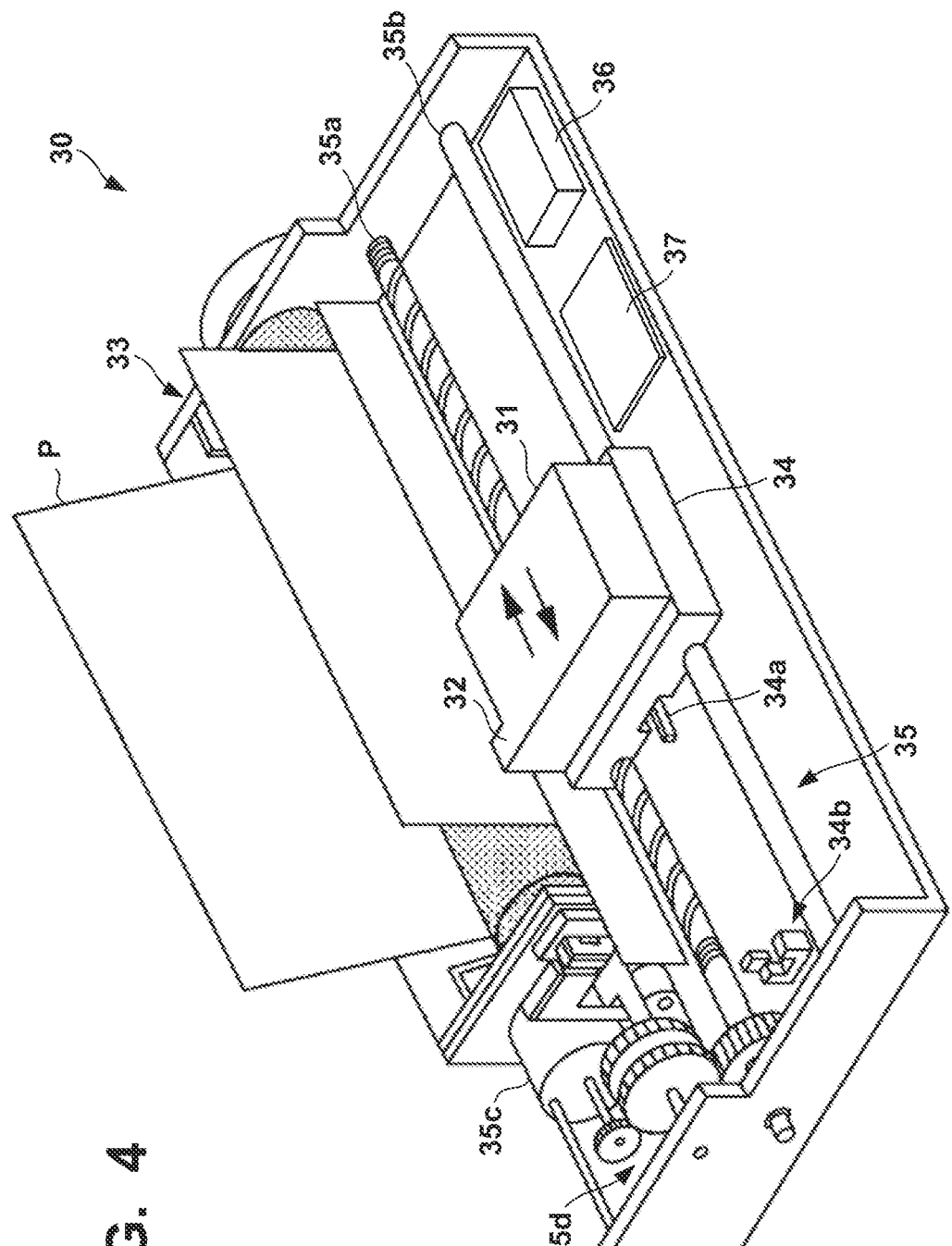
FIG. 4 is a view showing the outer appearance of a printing apparatus according to an embodiment of the present invention.

FIG. 4 is a view showing the outer appearance of a printing apparatus 30 according to an embodiment of the present invention. The printing apparatus 30 is an inkjet printing apparatus that performs printing on a print medium by discharging ink.

Note that "print" includes not only formation of significant information such as a character or graphic pattern but also formation of an image, design, or pattern on print media in a broader sense and processing of print media regardless of whether the information is significant or insignificant or has become obvious to allow human visual perception. Also, in this embodiment, "print medium" is assumed to be sheet-shaped paper but may be a fabric, a plastic film, or the like.

In addition, the printing apparatus to which the present invention can be applied is not limited to the inkjet printing apparatus, and the present invention can also be applied to, for example, a melt type or sublimation type thermal transfer printing apparatus. The printing apparatus may be a manufacturing apparatus configured to manufacture, for example, a color filter, an electronic device, an optical device, a microstructure, or the like by a predetermined printing method. The printing apparatus may be an apparatus for forming a three-dimensional image from 3D data.

The printing apparatus 30 includes an ink tank 31 and a printhead 32, which are formed as one unit, and these are mounted on a carriage 34. The printhead 32 discharges ink stored in the ink tank 31 to a print medium P, thereby performing printing. The carriage 34 can be moved by a drive unit 35 reciprocally in the directions of arrows. The drive unit 35 includes a lead screw 35a and a guide shaft 35b, which are extended in the moving direction of the carriage 34. The lead screw 35a engages with a screw hole (not shown) of the carriage 34, and the carriage 34 moves along with the rotation of the lead screw 35a. A motor 35c and a gear train 35d form the rotation mechanism of the lead screw 35a. The guide shaft 35b guides the movement of the carriage 34. A photosensor 34b configured to detect a detection target piece 34a of the carriage 34 is arranged at one end of the moving range of the carriage 34, and the detection result is used to control the movement of the carriage 34.

A conveying unit 33 conveys the print medium P. The conveying unit 33 includes a motor (not shown) that is a drive source, and a conveyance roller (not shown) that is rotated by the drive force of the motor. The print medium P is conveyed along with the rotation of the conveyance roller.

The printing apparatus 30 includes an internal power supply 36 configured to supply power to be consumed by the printing apparatus 30, and a control circuit 37 configured to control the printing apparatus 30. The control circuit 37 causes the units to alternately perform the movement of the printhead 32 by the movement of the carriage 34 and ink discharge, and the conveyance of the print medium P, thereby printing an image on the print medium P.

Figure 5A:
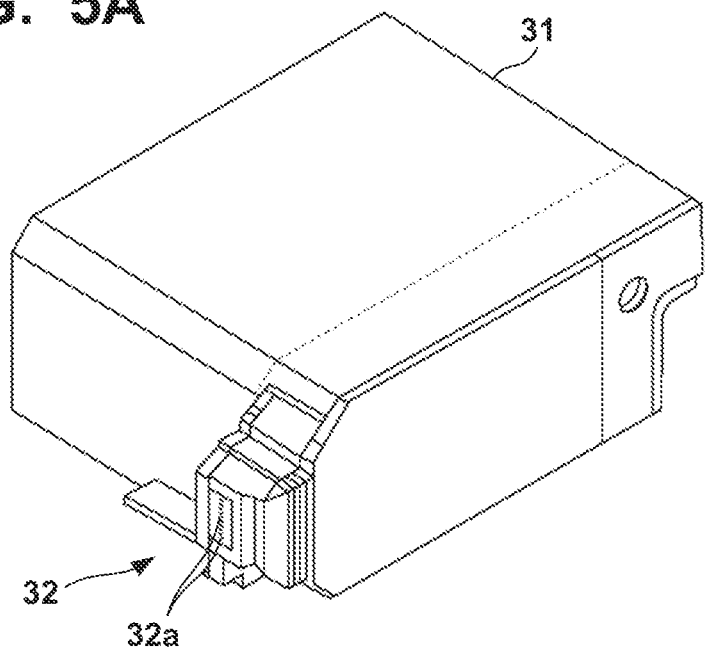
FIG. 5A is a perspective view of the periphery of a printhead.
Figure 5B:
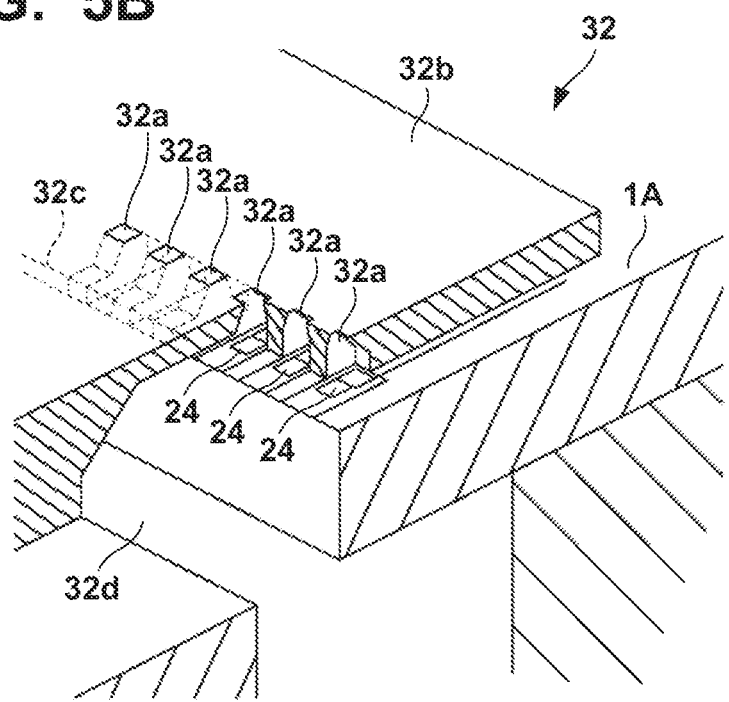
FIG. 5B is a cutaway view of the periphery of ink discharge ports.

FIG. 5A is a perspective view of the ink tank 31 and the printhead 32, which are formed as one unit. The ink tank 31 and the printhead 32 can be separated at the position of a broken line. The printhead 32 includes a plurality of ink discharge ports 32a configured to discharge ink. FIG. 5B is a cutaway view of the printhead 32, which shows the structure on the periphery of the ink discharge ports 32a.

The printhead 32 includes a channel forming member 32b and an element substrate 1A. The channel forming member 32b forms the ink discharge ports 32a, a channel 32c configured to supply ink to the ink discharge ports 32a and a common liquid chamber 32d. The element substrate 1A is provided with discharge elements 24 corresponding to the ink discharge ports 32a. The discharge element 24 according to this embodiment is an element that discharges a liquid (ink) in accordance with supply of power, and is particularly an electrothermal transducer (heater). The electrothermal transducer generates heat upon energization to foam ink, and discharges the ink from the ink discharge port 32a by the foaming energy. Note that the discharge element 24 may be not an electrothermal transducer but a piezoelectric element.

Figure 6:
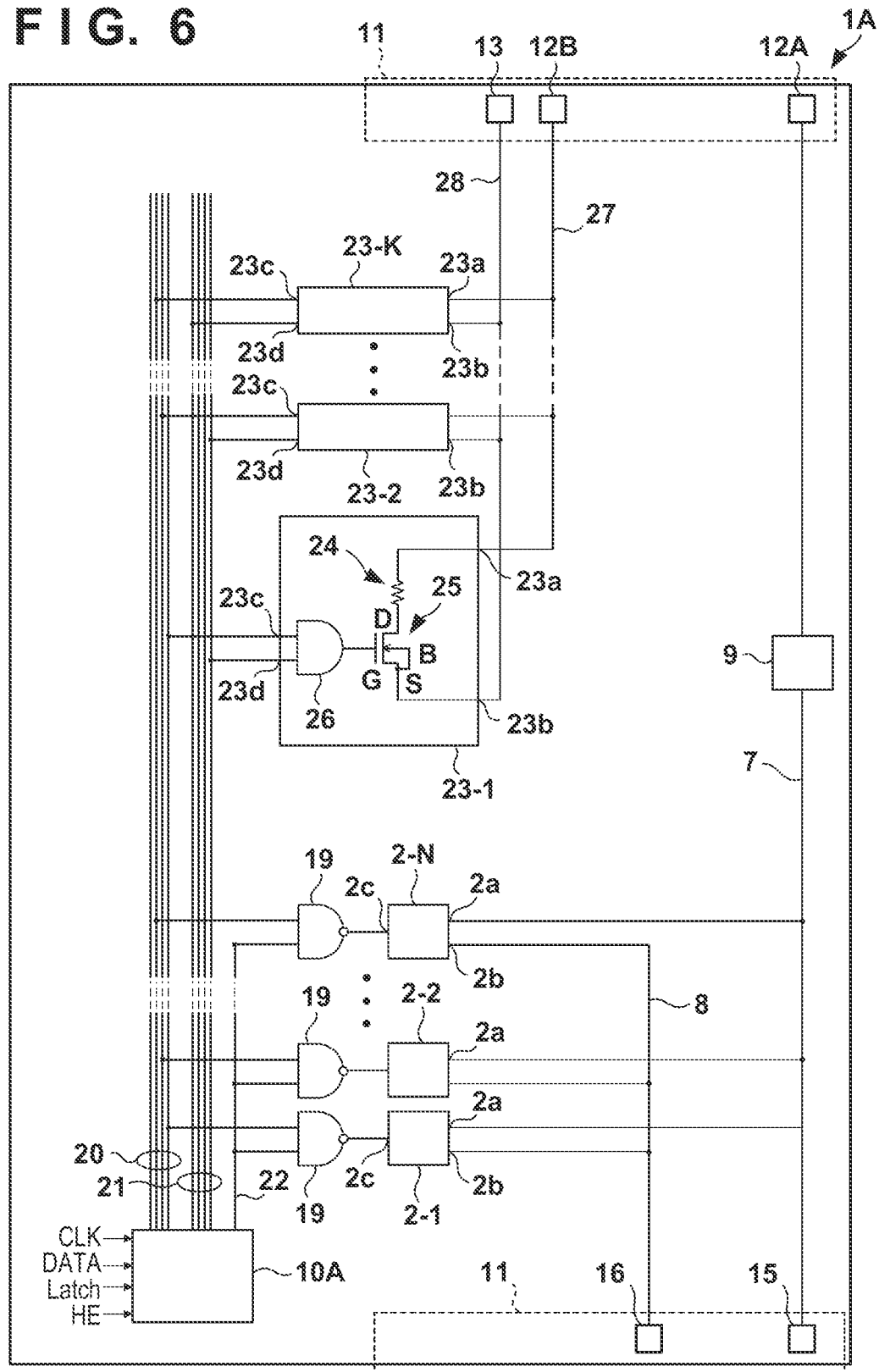
FIG. 6 is a circuit diagram of a substrate according to another embodiment of the present invention.

FIG. 6 is a circuit diagram of the element substrate 1A. The element substrate 1A is configured by mounting the discharge elements 24 and a drive circuit thereof on the substrate 1 described in the first embodiment, and functions not only as the structure for ink discharge but also as a storage device. The same reference numerals as in the substrate 1 described in the first embodiment denote the same components in the element substrate 1A shown in FIG. 6, and a description thereof will be omitted, or a simple description will be made.

The electrode pads of an electrode pad group 11 are in contact with contacts (not shown) provided on the carriage 34 and are electrically connected to these. The carriage 34 is connected to the control circuit 37 via a cable (not shown), and electrical signals from the control circuit 37 and the power supply voltage of the internal power supply 36 via the control circuit 37 are applied to the electrode pad group 11 via the cable and the carriage 34.

The electrode pad group 11 includes electrode pads 12A and 12B to which the power supply voltage from the internal power supply 36 is input. A voltage for write to memory units 2 is applied to the electrode pad 12A, and the write voltage is supplied to a wiring 7 via a voltage applying circuit 9. A drive voltage of the discharge elements 24 is applied to the electrode pad 12B. In this embodiment, the two electrode pads 12A and 12B are provided. However, if the write voltage of the memory units 2 is the same as the drive voltage of the discharge elements 24, or if the voltage applying circuit 9 includes a boosting circuit or a step-down circuit, one electrode pad corresponding to the electrode pads 12A and 12B may be used.

The element substrate 1A includes a plurality of drive units 23-1 to 23-K. In this embodiment, K drive units 23-1 to 23-K are provided in correspondence with K ink discharge ports 32a. The drive units 23-1 to 23-K will be expressed as drive units 23 collectively or without distinction between individual drive units. Each drive unit 23 is an ink discharge drive circuit including the discharge element 24. FIG. 6 shows the circuit of only the drive unit 23-1. The remaining drive units 23-2 to 23-N have the same circuit.

The K drive units 23 are connected in parallel between a wiring 27 and a wiring 28. The discharge element 24 of each drive unit 23 is connected to the wiring 27 via a connection point 23a. Also, the discharge element 24 of each drive unit 23 is connected to the wiring 28 via a switching element 25 and a connection point 23b. In this embodiment, the drive voltage of the discharge element 24 is applied to the wiring 27, and the wiring 28 is set at the ground potential (GND potential). The drive voltage is, for example, 24 V.

The switching element 25 is an element that switches drive voltage application to the discharge element 24, and is an NMOS transistor in this embodiment. A drain D of the switching element 25 is connected to the discharge element 24, and a source S and a back gate B are connected to the wiring 28 via the connection point 23b. When the switching element 25 is turned on, the voltage applied to the wiring 27 can be applied to the discharge element 24. A gate G of the switching element 25 is connected to an AND circuit 26. When a signal of high level is input from the AND circuit 26 to the gate G, the switching element 25 is turned on. One input of the AND circuit 26 is connected to one line of a signal line group 20, and the other input is connected to one line of a signal line group 21.

A NAND circuit 19 is connected to a connection point 2c of each memory unit 2. When a signal of low level is input from the NAND circuit 19 to the connection point 2c, the switching element 4 is turned on. One input of the NAND circuit 19 is connected to one line of the signal line group 20, and the other input is connected to a signal line 22.

The element substrate 1A includes a signal control circuit 10A. The signal control circuit 10A outputs corresponding control signals (selection signals) to the drive units 23 and the memory units 2. The signal control circuit 10A is formed by, for example, a shift register, a latch circuit, and the like. A clock signal CLK, a data signal DATA, a latch signal LT, a heater control signal HE, and the like are input from the control circuit 37 to the signal control circuit 10A, thereby selecting drive of each drive unit 23.

The drive units 23 can be driven time-divisionally. The K drive units 23 are divided into a plurality of groups and driven on a group basis. In time division drive, the signal control circuit 10A outputs a group selection signal for selecting a group to a signal line group 52, and further outputs a block selection signal for selecting the drive units 23 to be driven in the group to a signal line group 53.

A corresponding group selection signal and block selection signal are input to the AND circuit 26. When both signals are on, the switching element 25 is turned on. When the switching element 25 is on, the discharge element 24 connected in series is driven.

A corresponding block selection signal and a control signal from the signal line 22 are input to the NAND circuit 19, and accordingly, the switching element 4 is on/off-controlled (when both signals are on, the switching element 4 is turned on).

As described above, in this embodiment, the element substrate 1A can be caused to function not only as an ink discharge substrate but also as a storage device.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-038579, filed Mar. 10, 2021, which is hereby incorporated by reference herein in its entirety.

What is claimed is:

1. A substrate comprising:
    a plurality of memory units each including an anti-fuse element and a switching element configured to switch application of a predetermined voltage to the anti-fuse element;
    a first wiring and a second wiring between which the plurality of memory units are connected in parallel, the second wiring being set at a ground potential;
    a first electrode pad to which a voltage for supplying the predetermined voltage to the first wiring is applied; and
    a second electrode pad to which a voltage for supplying the predetermined voltage to the first wiring is applied.

2. The substrate according to claim 1, further comprising a voltage applying unit connected between the first electrode pad and the first wiring and configured to apply the predetermined voltage to the wiring based on the voltage applied to the first electrode pad.

3. The substrate according to claim 1, wherein the second electrode pad is connected to the first wiring.

4. The substrate according to claim 1, wherein the first electrode pad is an electrode pad to which an internal power supply of a device including the substrate is connected, and wherein the second electrode pad is an electrode pad to which an external power supply outside the device is connected.

5. The substrate according to claim 1, wherein the memory unit includes a resistive element connected between the anti-fuse element and the first wiring.

6. The substrate according to claim 1, wherein the memory unit includes a resistive element connected in parallel with the anti-fuse element.

7. The substrate according to claim 1, wherein the anti fuse element has a MOS structure,
wherein, when the predetermined voltage is applied, a gate insulating film of the MOS structure causes dielectric breakdown, and a resistance value of the anti-fuse element lowers, and
wherein the switching element is a DMOS transistor.

8. The substrate according to claim 1, further comprising a plurality of discharge elements each configured to discharge a liquid in accordance with supply of power.

9. The substrate according to claim 8, wherein the plurality of discharge elements is a heater.

10. A printing apparatus comprising:
a printhead configured to discharge ink to a print medium; and
a power supply,
wherein the printhead comprises a substrate including a plurality of discharge elements each configured to discharge the ink, and
wherein the substrate comprises:
a plurality of memory units each including an anti fuse element and a switching element configured to switch application of a predetermined voltage to the anti-fuse element;
a first wiring and a second wiring between which the plurality of memory units are connected in parallel, the second wiring being set at a ground potential;
a first electrode pad to which a voltage for supplying the predetermined voltage to the wiring is applied by the power supply; and
a second electrode pad to which a voltage for supplying the predetermined voltage to the first wiring is applied by a power supply outside the printing apparatus.

11. A method of manufacturing a substrate,
wherein the substrate comprises:
a plurality of memory units each including an anti fuse element and a switching element configured to switch application of a predetermined voltage to the anti-fuse element; and
a first wiring and a second wiring between which the plurality of memory units are connected in parallel, the second wiring being set at a ground potential, and
wherein the method comprises:
applying the predetermined voltage to the first wiring by a first power supply and a second power supply; and
applying the predetermined voltage to the anti fuse elements of a plurality of memory units of the plurality of memory units by the corresponding switching elements.

* * * * *